United States Patent
Lee et al.

(10) Patent No.: US 7,042,261 B2
(45) Date of Patent: May 9, 2006

(54) DIFFERENTIAL CHARGE PUMP AND PHASE LOCKED LOOP HAVING THE SAME

(75) Inventors: Jin-Kug Lee, Suwon (KR); Du-Hwan Choi, Suwon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 117 days.

(21) Appl. No.: 10/681,269

(22) Filed: Oct. 9, 2003

(65) Prior Publication Data

US 2004/0119544 A1 Jun. 24, 2004

(30) Foreign Application Priority Data

Dec. 20, 2002 (KR) ............... 10-2002-0081737

(51) Int. Cl.
*H03L 7/06* (2006.01)
(52) U.S. Cl. ..................... 327/157; 327/148
(58) Field of Classification Search ............ 331/16, 331/17, 37, 175, 177, 184; 330/258; 327/536, 327/537, 589, 148, 157, 390
See application file for complete search history.

(56) References Cited

U.S. PATENT DOCUMENTS

| | | | | |
|---|---|---|---|---|
| 5,736,880 A * | 4/1998 | Bruccoleri et al. | ......... | 327/157 |
| 5,740,213 A * | 4/1998 | Dreyer | ............. | 375/374 |
| 6,275,097 B1 * | 8/2001 | Liang et al. | ............. | 327/536 |
| 6,385,265 B1 * | 5/2002 | Duffy et al. | ............. | 375/374 |
| 6,686,794 B1 * | 2/2004 | Abidin et al. | ............. | 327/537 |
| 6,771,102 B1 * | 8/2004 | Abidin et al. | ............. | 327/157 |
| 6,825,730 B1 * | 11/2004 | Sun | ................. | 331/16 |
| 6,847,251 B1 * | 1/2005 | Kao | .................. | 327/536 |

* cited by examiner

Primary Examiner—Kenneth B. Wells
Assistant Examiner—Hai L. Nguyen
(74) Attorney, Agent, or Firm—Harness, Dickey & Pierce, P.L.C.

(57) ABSTRACT

A switching control signal generating circuit for reducing glitches from occurring in a charge pump during switching. Additionally, a phase locked loop including the charge pump is provided. The switching control signal generating circuit obtains a time difference in output signals based upon the signals input to the generating circuit. Combining the switching control signal generating circuit with a charge pump reduces glitches during switching. Similarly the jitter in the output signal of a phase locked loop, using the charge pump, can be reduced.

10 Claims, 8 Drawing Sheets

FIG. 4

| UP | 0(=LOW) | 1(=HIGH) | DN | 0 | 1 |
|----|---------|----------|----|----|----|
| S1 | OFF | ON | S3 | OFF | ON |
| S2 | ON | OFF | S4 | ON | OFF |
| S7 | ON | OFF | S5 | ON | OFF |
| S8 | OFF | ON | S6 | OFF | ON |

DIFFERENTIAL CHARGE PUMP AND PHASE LOCKED LOOP HAVING THE SAME

BACKGROUND OF THE INVENTION

This application claims priority from Korean Patent Application No. 10-2002-81737 filed Dec. 20, 2002, the entire contents of which are hereby incorporated by reference.

1. Field of the Invention

The present invention relates to reducing the occurrence of glitches during switching and in particular reducing the occurrence of glitches during switching when using differential charge pumps and phase locked loops.

2. Description of the Related Art

A phase locked loop (PLL) is a circuit for generating a clock signal with a phase which is equal to that of an input signal or leads the input signal by a predetermined amount.

FIG. 1 is a block diagram of a conventional phase locked loop. Referring to FIG. 1, the PLL 100 includes a phase-frequency detector (PFD) 10, a charge pump 20, a low pass filter 30, and a voltage controlled oscillator (VCO) 40.

The phase-frequency detector 10 receives a reference clock signal CREF and a feedback clock signal FVCO and outputs a phase error signal UP or DOWN corresponding to a phase difference between the two signals CREF and FVCO. UP corresponds to a forward phase difference of one signal relative to the other signal (chosen as the reference signal). DOWN corresponds to a backward phase difference of one signal with respect to the chosen reference signal.

When a switch S1 is turned on in response to the signal UP, the charge pump 20 charges capacitors C1 and C2 of the low pass filter 30, which can be coupled to an output terminal VCP. When a switch S2 is turned on, in response to the signal DOWN, the charge pump 20 discharges the charges from the capacitors C1 and C2 to a ground voltage.

The voltage controlled oscillator VCO 40 outputs a clock signal CVCO, having a frequency which is proportional to a voltage of the output terminal VCP of the charge pump 20, to a predetermined internal circuit and a frequency divider 50.

The frequency divider 50 outputs the clock signal CVCO to the phase-frequency detector 10 or divides the clock signal CVCO by a predetermined ratio and outputs the result to the phase-frequency detector 10. However, noise in the voltage of the output terminal VCP of the charge pump 20 causes jitter in the clock signal CVCO of the voltage controlled oscillator 40.

For example, when a voltage of the output terminal VCP of the charge pump 20 is 1V, the voltage controlled oscillator 40 generates a clock signal CVCO of 200 MHz and has a frequency gain of 50 MHz/V, if 100 mV noise is input to the output terminal VCP of the charge pump 20, the clock signal CVCO of the voltage controlled oscillator 40 varies within the range of 200 MHz±5 MHz.

Accordingly, a circuit using the clock signal CVCO of the voltage controlled oscillator 40 as a reference clock signal is limited by a timing margin such as a setup time or a hold time.

Also, a circuit using the clock signal CVCO of the voltage controlled oscillator 40 as a reference clock signal is liable to malfunction and is limited by the greatest operating frequency.

As a result, even if a circuit is designed using a method which minimizes noise in the voltage of the output terminal VCP of the charge pump 20, it is fundamentally difficult to reduce jitter in the output of the voltage controlled oscillator 40.

SUMMARY OF THE INVENTION

Exemplary embodiments of the present invention provide a differential charge pump by which jitter in the output of a voltage controlled oscillator can be fundamentally reduced.

Exemplary embodiments of the present invention also provide a switching control signal generating circuit, which is included in the differential charge pump and reduces glitches from occurring in the differential charge pump.

Exemplary embodiments of the present invention further provides a phase locked loop including the differential charge pump.

An exemplary embodiment of the present invention, provides a switching control signal generating circuit, which comprises a pair of input terminals, a pair of output terminals, and a conversion circuit which converts differential signals input via the pair of input terminals into differential switching control signals and outputs the differential switching control signals to the pair of output terminals. Based on the state of each of the differential signals input via the pair of input terminals, the conversion circuit makes a first one of the differential switching control signals having a relatively high level, and a second one of the differential switching control signals having a relatively low level, transition to the level of the second signal and the level of the first signal, respectively, at different time points.

In another exemplary embodiment of the present invention, the first signal starts to transition to the level of the second signal before the second signal starts to transition to the level of the first signal. However, the first signal may start to transition to the level of the second signal after the second signal starts to transition to the level of the first signal. The first and second signals are differential signals.

In accordance with another exemplary embodiment of the present invention, there is provided a switching control signal generating circuit, comprising a first delay circuit which delays a first input terminal signal, a second delay circuit which delays a complementary a second input terminal signal, a first pull-up circuit, which is connected between a first power supply voltage and a first output terminal and pulls up a level of the first output terminal to a level of the first power supply voltage in response to an output signal of the first delay circuit, a first pull-down circuit which is connected between the first output terminal and a second power supply voltage and pulls down a level of the first output terminal to the level of the second power supply voltage in response to the complementary input signal, a second pull-up circuit which is connected between the first power supply voltage and a second output terminal and pulls up a level of the second output terminal to the level of the first power supply voltage in response to an output signal of the second delay circuit, and a second pull-down circuit which is connected between the second output terminal and the second power supply voltage and pulls down a level of the second output terminal to the level of the second power supply voltage in response to the input signal.

The output signals of the first and second output terminals are differential signals. The first and second delay circuits are inverters.

In accordance with yet another exemplary embodiment of the present invention, there is provided a switching control signal generating circuit, comprising a first delay circuit which delays an input signal input to a first input terminal, a second delay circuit which delays a complementary input signal input to a second input terminal, a first pull-down circuit which is connected between a first output terminal and a ground voltage and pulls down a level of the first output terminal to a level of the ground voltage in response to an output signal of the first delay circuit, a first pull-up circuit which is connected between a power supply voltage and the first output terminal and pulls up a level of the first output terminal to a level of the power supply voltage in response to the complementary input signal, a second pull-down circuit which is connected between a second output terminal and the ground voltage and pulls down a level of the second output terminal to the level of the ground voltage in response to an output signal of the second delay circuit, and a second pull-up circuit which is connected between the second output terminal and the power supply voltage and pulls up a level of the second output terminal to the level of the power supply voltage in response to the input signal.

In accordance with still another exemplary embodiment of the present invention, there is provided a charge pump, comprising a first output terminal, a second output terminal, a first current source coupled to a power supply voltage, a second current source coupled to the power supply voltage, a first current sink coupled to a ground voltage, a second current sink coupled to the ground voltage, first differential switches which are connected between the first output terminal and the first current source and respond to first differential switching control signals, second differential switches which are connected between the second output terminal and the first current sink and respond to second differential switching control signals, third differential switches which are coupled to the second output terminal and the second current source and respond to the first differential switching control signals, and fourth differential switches which are connected between the second output terminal and the second current sink and respond to the second differential switching control signals.

The output signals of the first and second output terminals are differential signals.

The first current source, the second current source, the first current sink, and the second current sink have the same current values.

Another exemplary embodiment of the present invention, provides a charge pump, comprising a first input terminal, a second input terminal, a third input terminal, a fourth input terminal, a first output terminal, a second output terminal, a pumping circuit which charges the first output terminal to a first voltage and simultaneously discharges the second output terminal into a second voltage in response to first differential signals input to the first and second input terminals, or charges the second output terminal to the first voltage and simultaneously discharges the first output terminal into the second voltage in response to second differential signals input to the third and fourth input terminals, and a common mode feedback circuit which is coupled to the first and second output terminals and holds a common voltage of output voltages of the first and second output terminals to a predetermined value. The output voltages of the first and second output terminals are differential signals.

Another exemplary embodiment of the present invention, provides a phase locked loop including the foregoing charge pump, which comprises a phase-frequency detecting circuit which outputs the first differential signals and the second differential signals and a voltage controlled oscillator which generates an output clock signal in response to a difference between the output voltage of the first output terminal and the output voltage of the second output terminal. The phase-frequency detecting circuit outputs the first differential signals and the second differential signals in response to a reference clock signal and the output clock signal.

The voltage controlled oscillator includes a voltage-current converter which generates current corresponding to the difference between the output voltage of the first output terminal and the output voltage of the second output terminal, and a vibrator which generates the output clock signal in response to the output signal of the voltage-current converter.

When the phase locked loop further includes a frequency divider to divide the output clock signal output from the voltage controlled oscillator, the phase-frequency detecting circuit outputs the first differential signals and the second differential signals in response to the reference clock signal and the output clock signal output from the frequency divider. Another exemplary embodiment of the present invention provides a switching control signal generator can have input terminals, where the input terminals carry a plurality of input signals and output terminals, where the output terminals carry a plurality of output signals. A conversion circuit converts a plurality of the input signals into a plurality of output signals, where the output signals are differential switching control signals having a plurality of levels of voltage transition. The differential switching signals transition from one level to another level at different times.

Another exemplary embodiment of the present invention provides a method of generating switching control signals. Input signals are inserted, and the input signals are converted to a plurality of output signals, where a plurality of the output signals are differential switching control signals. The differential switching control signals are transitioning from a plurality of voltage levels, where each of the differential switching control signals are temporally shifted as a result of the step of converting. The temporal shifts in the differential switching control signals are used to reduce glitch and/or jitter in secondary signals.

Another exemplary embodiment of the present invention provides a method of charge pumping. Input signals are inserted into a switching control generating circuit, where the switching control generating circuit produces first and second differential switching control signals. The first and second differential switching control signals are temporally shifted with respect to each other. Further a first output terminal is charged to a first voltage and a second output terminal is simultaneously discharged into a second voltage in response to the first differential switching control signal. Alternatively the second output terminal is charged to the first voltage and the first output terminal is simultaneously discharged into the second voltage in response to the second differential switching control signal.

BRIEF DESCRIPTION OF THE DRAWINGS

The above features of embodiments of the present invention will become more apparent from the detailed description and accompanying drawings, wherein:

FIG. 4 is a table listing operations of respective switches of FIG. 3 in an exemplary embodiment of the present invention;

DETAILED DESCRIPTION OF EXEMPLARY EMBODIMENTS OF THE INVENTION

The following description of the exemplary embodiment(s) is merely exemplary in nature and is in no way intended to limit the invention, its application, or uses.

Exemplary embodiments of the present invention will now be described more fully with reference to the accompanying drawings, in which exemplary embodiments of the invention are shown.

Figure 1:
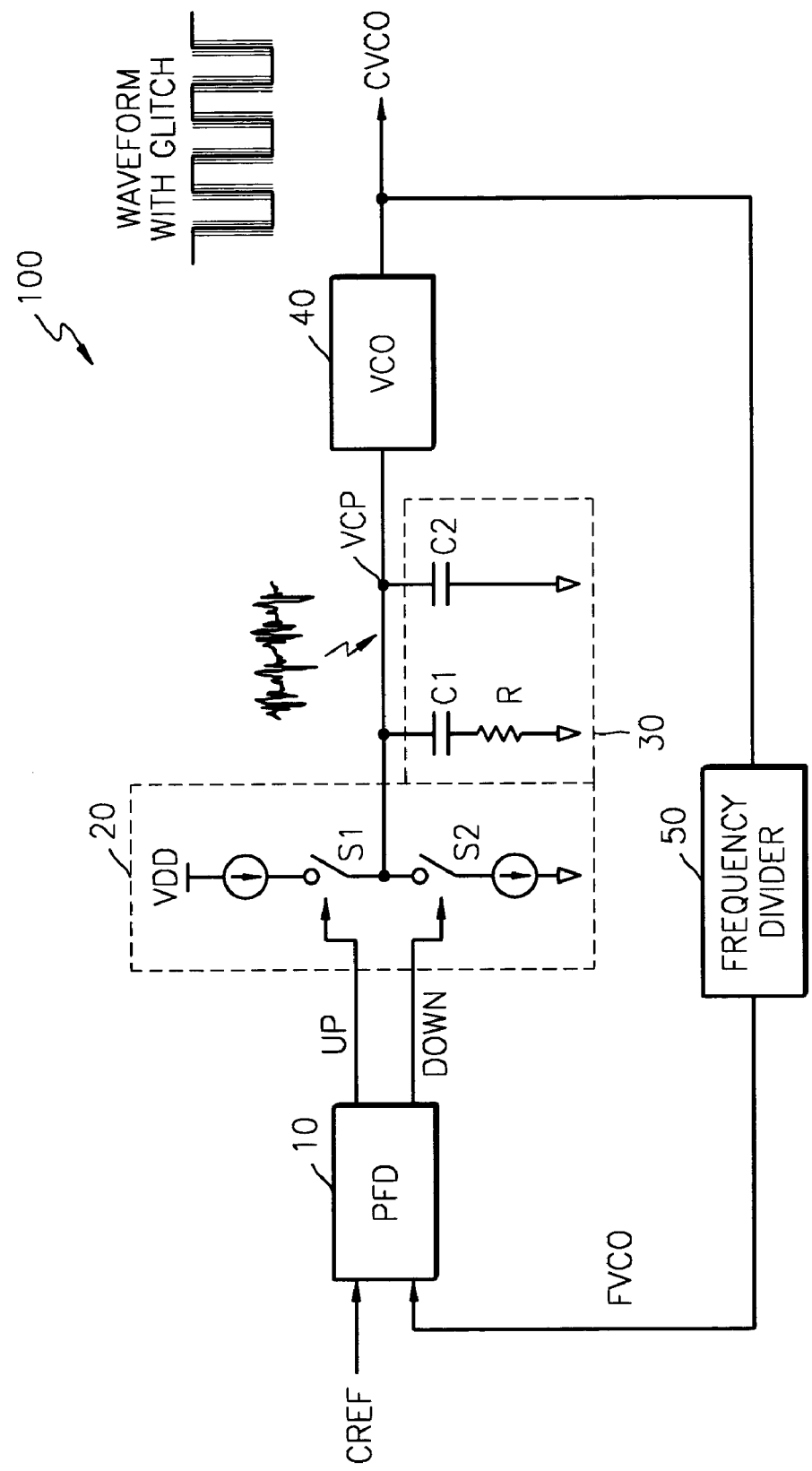
FIG. 1 is a block diagram of a conventional phase locked loop.
Figure 2:
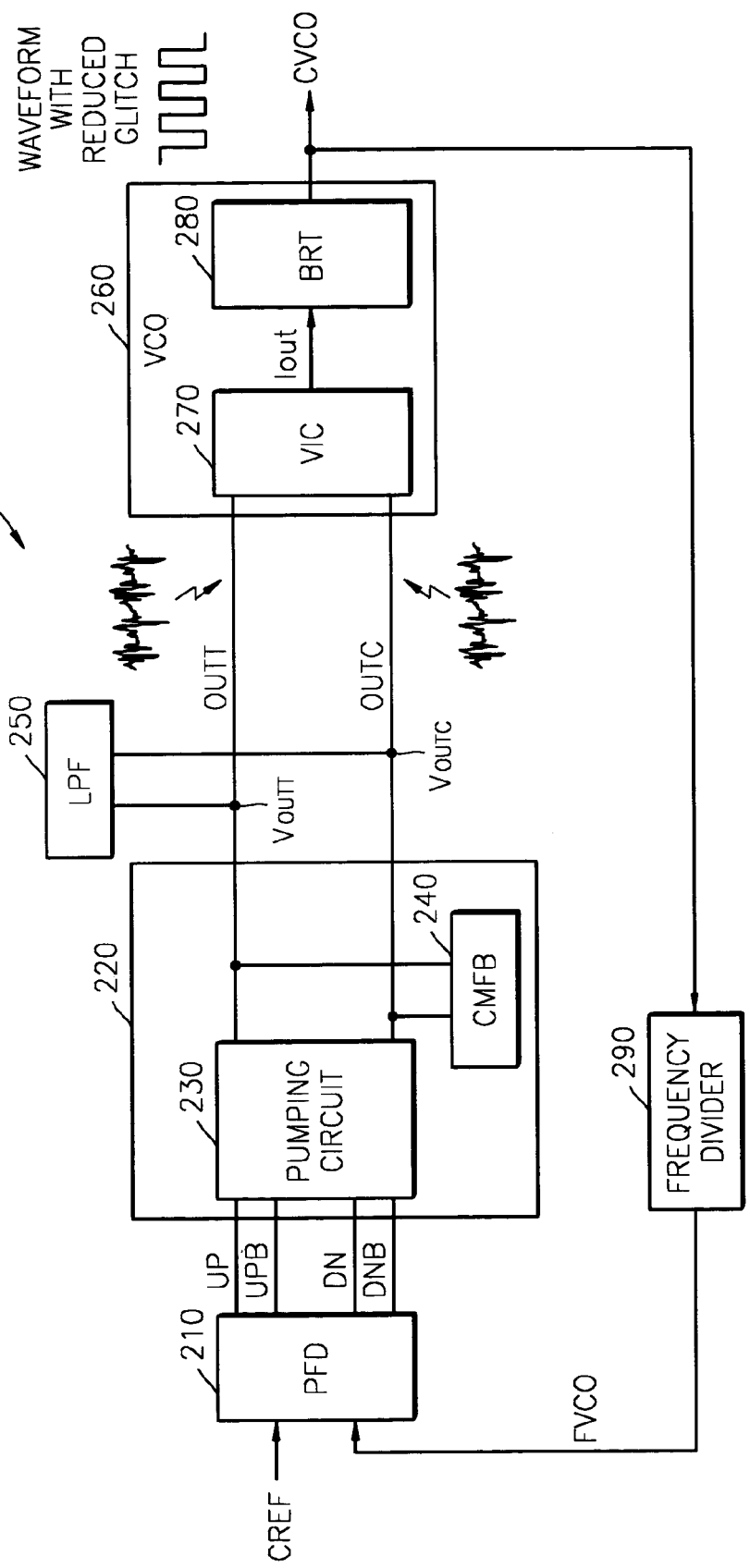
FIG. 2 is a block diagram of a phase locked loop including a differential charge pump according to an exemplary embodiment the present invention.

FIG. 2 is a block diagram of a phase locked loop including a differential charge pump according to an exemplary embodiment of the present invention. Referring to FIG. 2, the phase locked loop 200, which operates differentially, includes a phase-frequency detector 210, a charge pump 220, a low pass filter 250, a voltage controlled oscillator 260, and a frequency divider 290.

The charge pump 220 includes a pumping circuit 230 and a common mode feedback circuit 240. The voltage controlled oscillator 260 includes a voltage-current converter 270 and a frequency oscillator 280. Examples of the frequency oscillator 280 are a crystal-tuned oscillator or a vibrator.

The phase-frequency detector 210 compares the frequency and phase of a reference clock signal CREF (an external system clock signal) to those of a feedback clock signal FVCO (an internal clock signal) and outputs first differential signals UP and UPB and second differential signals DN and DNB corresponding to the comparison results. The charge pump 220 charges a first output terminal OUTT with a first current and simultaneously discharges a second output terminal OUTC with the first current in response to the first differential signals UP and UPB or in response to the second differential signals DN and DNB. The voltages of the first and second output terminals OUTT and OUTC are differential signals or complementary signals.

The low pass filter 250 is coupled to the first output terminal OUTT and the second output terminal OUTC and filters high frequency noise from the voltages of the first and second output terminals OUTT and OUTC.

The voltage controlled oscillator 260 outputs an output clock signal CVCO having a frequency and phase which depend on a voltage difference between the first and second output terminals OUTT and OUTC to predetermined internal circuits (not shown) and the frequency divider 290. The output clock signal CVCO can be employed as a reference clock signal in other circuits (not shown). Also, the output clock signal CVCO may be directly fed back to the phase-frequency detector 210.

The frequency divider 290 divides the output clock signal CVCO of the voltage controlled oscillator 260 by a predetermined ratio and outputs the result to the phase-frequency detector 210.

In the differential charge pump according to an exemplary embodiment of the present invention, since noise caused by a power supply voltage and/or a substrate has the same influence on both the first output terminal OUTT and the second output terminal OUTC of the charge pump 220, the voltage difference between the first output terminal OUTT and the second output terminal OUTC is not affected by the noise.

As the voltage-current converter 270 of the voltage controlled oscillator 260 detects the voltage difference between the first output terminal OUTT and the second output terminal OUTC and supplies the detection result to the frequency oscillator 280, the frequency oscillator 280 generates the output clock signal CVCO irrespective of the noise. Accordingly, jitter in the output clock signal CVCO of the phase locked loop 200, caused by the noise, is reduced according to the present invention.

Figure 3:
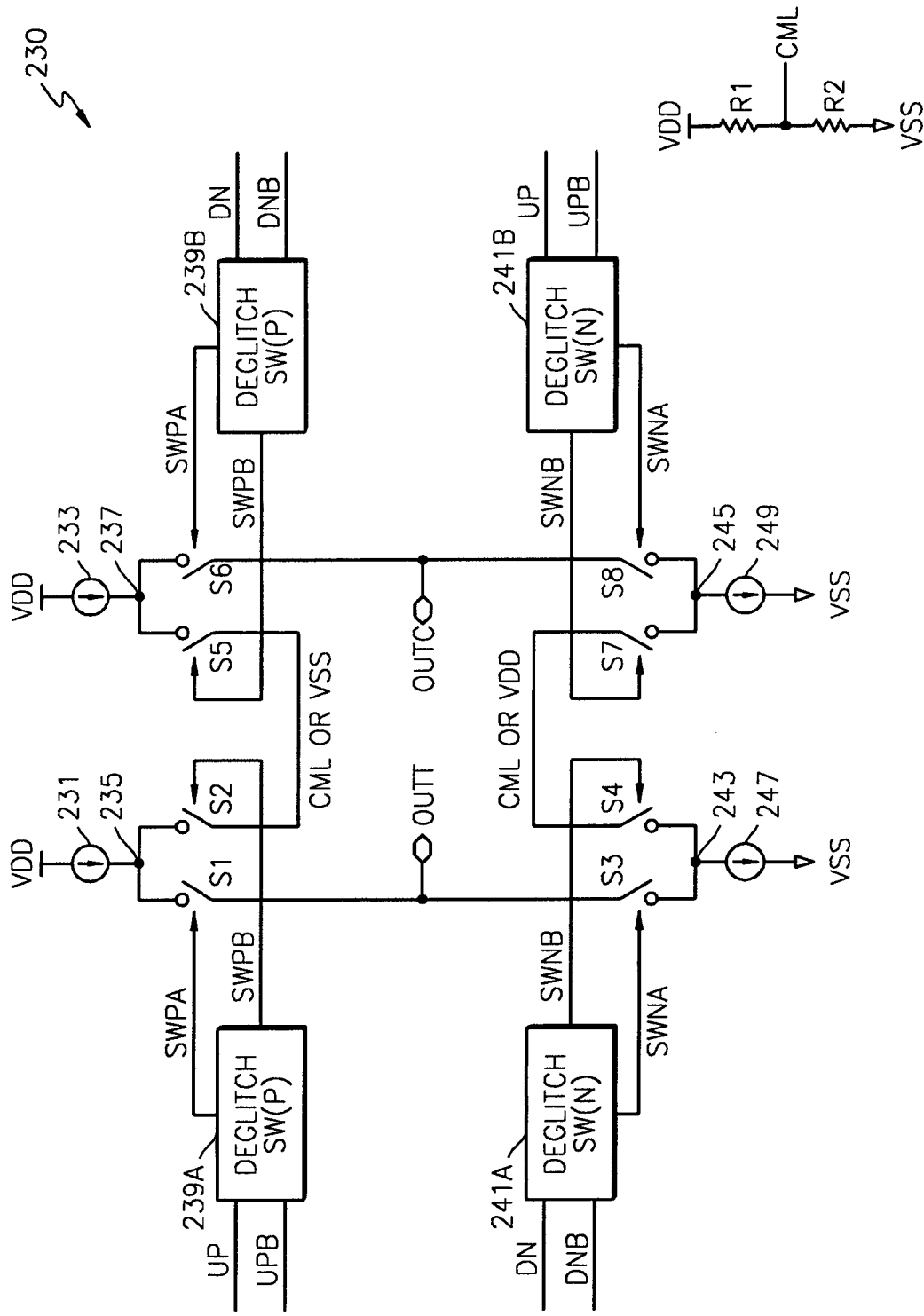
FIG. 3 is a block diagram of a pumping circuit of FIG. 2 in an exemplary embodiment of the present invention.

FIG. 3 is a block diagram of the pumping circuit of FIG. 2. Referring to FIG. 3, the pumping circuit 230 includes a first current source 231, a second current source 233, a first current sink 249, a second current sink 247, first differential switches S1 and S2, second differential switches S7 and S8, third differential switches S5 and S6, fourth differential switches S3 and S4, first switching control signal generating circuits 239A and 239B, and second switching control signal generating circuits 241A and 241B.

Figure 5:
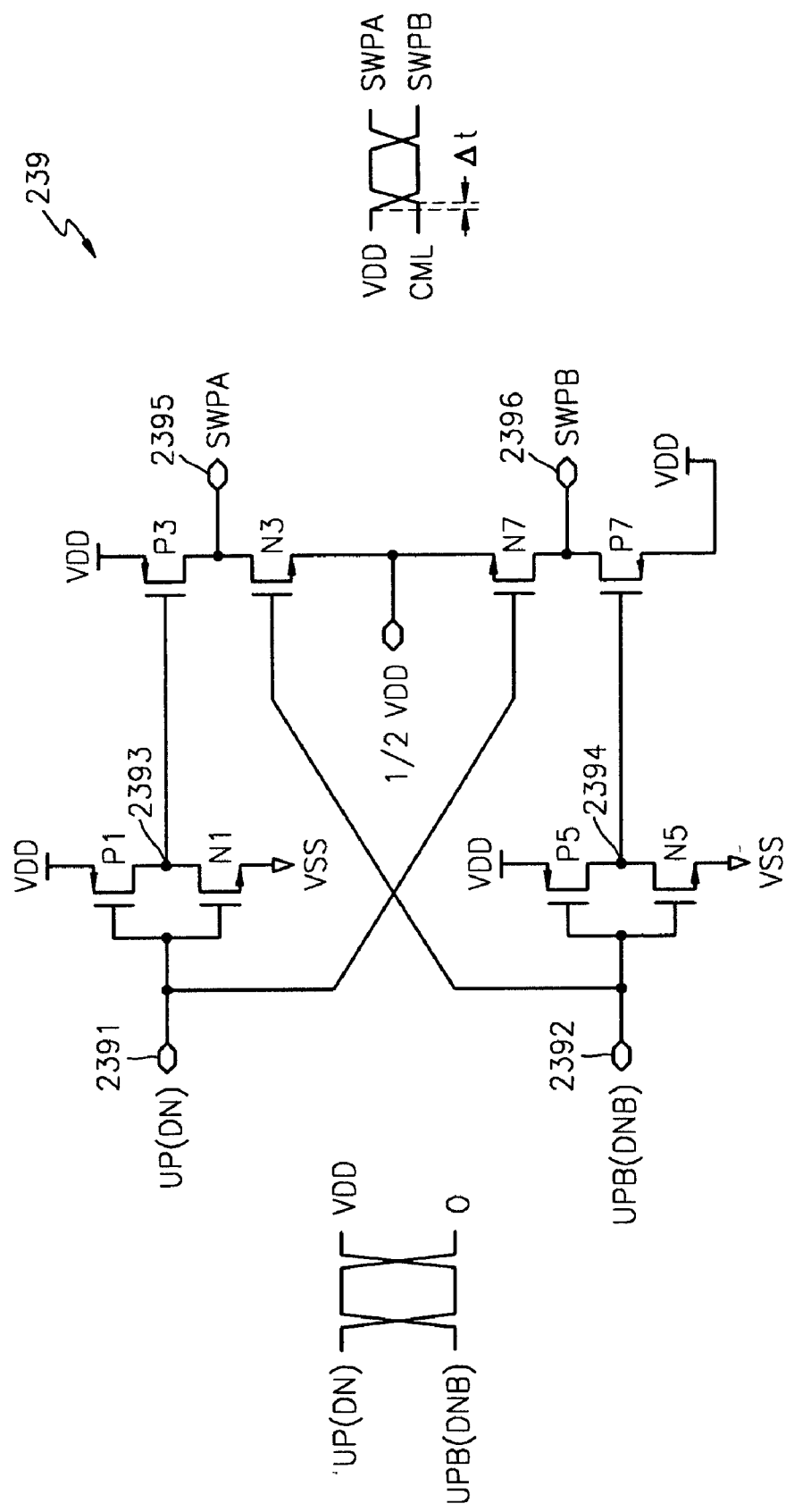
FIG. 5 is a switching control signal generating circuit for controlling differential switches, which are embodied as PMOS transistors in an exemplary embodiment of the present invention.
Figure 6:
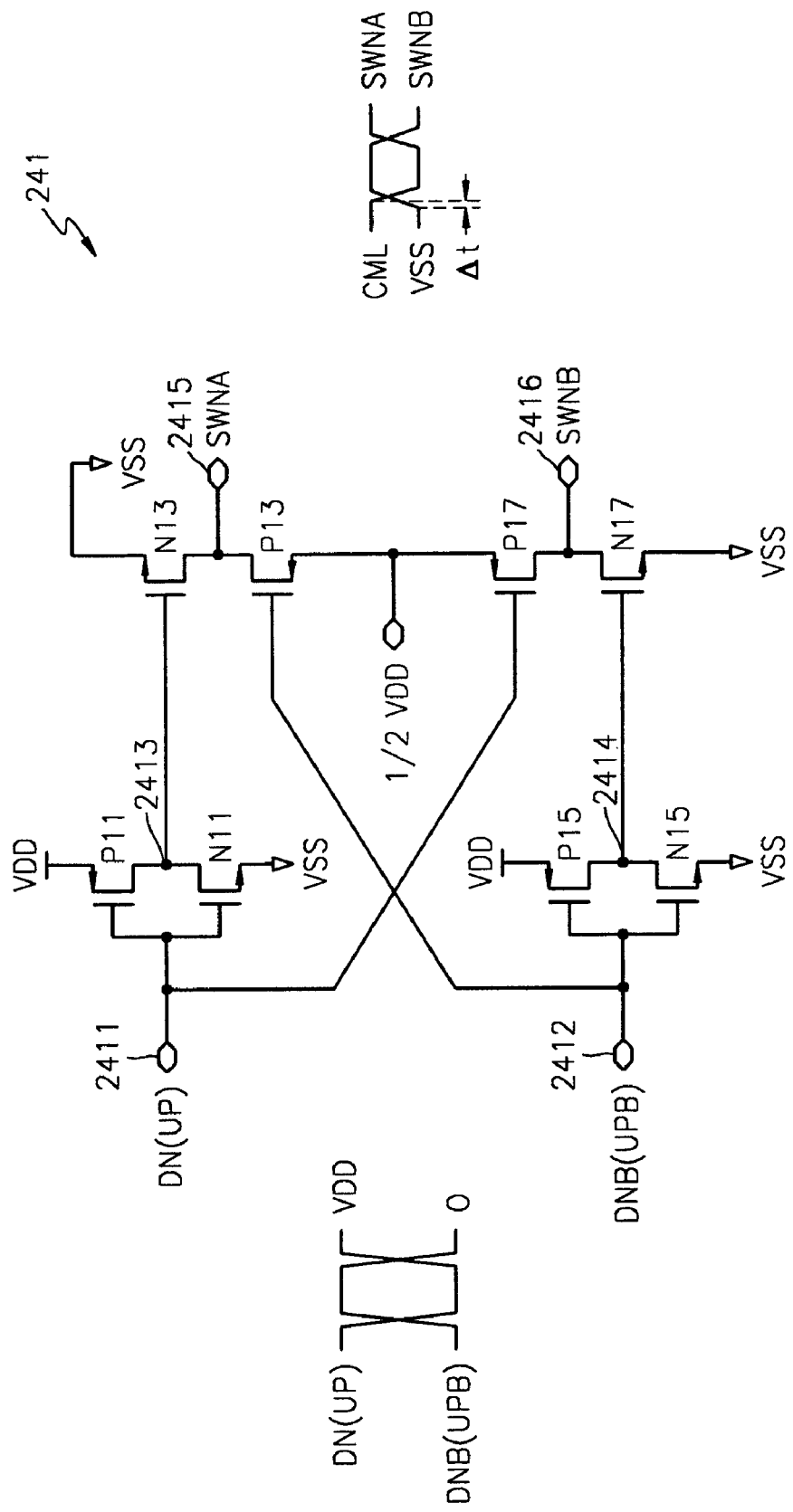
FIG. 6 is a switching control signal generating circuit for controlling differential switches, which are embodied as NMOS transistors in an exemplary embodiment of the present invention.

Each of the switching control signal generating circuits 239A, 239B, 241A, and 241B is illustrated in detail in FIGS. 5 and 6. Each of the switching control signal generating circuits 239A, 239B, 241A, and 241B is an example of a de-glitch circuit for reducing occurrence of glitches during switching of first through fourth differential switches.

The first current source 231 is connected between a power supply voltage VDD and the node 235, and the second current source 233 is connected between the power supply voltage VDD and a node 237.

The first current sink 249 is connected between a node 245 and a ground voltage VSS, and the second current sink 247 is connected between the node 243 and the ground voltage VSS. In an exemplary embodiment of the present invention, the first current source 231, the second current source 233, the first current sink 249, and the second current sink 247 have the same current values.

The first differential switches S1 and S2 are switched exclusively in response to corresponding first differential switching control signals SWPA and SWPB. Thus, the first current source 231 supplies current to the first output terminal OUTT via the first differential switch S1, or supplies the current to CML or the ground voltage VSS via the switch S2.

The second differential switches S7 and S8 are switched exclusively in response to corresponding second differential switching control signals SWNA and SWNB. Thus, the first current sink 249 sinks current from the second output terminal OUTC via the second differential switch S8, or sinks the current from CML or the power supply voltage VDD via the switch S7.

The third differential switches S5 and S6 are switched exclusively in response to the corresponding first differential switching control signals SWPA and SWPB. Thus, the second current source 233 supplies current to the second output terminal OUTC via the third differential switch S6, or supplies the current to the CML or the ground voltage VSS via the switch S5.

The fourth differential switches S3 and S4 are switched exclusively in response to corresponding second differential switching control signals SWNA and SWNB. Thus, the second current sink 247 sinks current from the first output terminal OUTT via the fourth differential switch S3, or sinks the current from the CML or the power supply voltage VDD via the switch S4.

Switching control signal generating circuit 239A generates differential switching control signals SWPA and SWPB and switching control signal generating circuit 241B generates differential switching control signals SWNA and SWNB, both in response to first differential signals UP and UPB. Likewise, switching control signal generating circuit 239B generates differential switching control signals SWPA and SWPB and switching control signal generating circuit 241A generates differential switching control signals SWNA and SWNB, both in response to second differential signals DN and DNB. The switches S2 and S5 are coupled to the CML or the ground voltage VSS, and the switches S4 and S7 are coupled to the CML or the power supply voltage VDD. Here, CML is a voltage obtained by dividing the power supply voltage VDD with two resistors R1 and R2. For example, when a resistance of the resistor R1 is equal to that of the resistor R2, the CML is 0.5 VDD.

FIG. 4 is a table illustrating the operations of each switch of FIG. 3. Referring to FIGS. 3 and 4, when a signal UP is logic high, each of the switches S1 and S8 is turned on and each of the switches S2 and S7 is turned off, the first output terminal OUTT is charged by the first current source 231 and simultaneously the second output terminal OUTC is discharged by the first current sink 249. In this case, a difference between voltages input to the voltage controlled oscillator 260, i.e., a voltage $V_{OUTT}$ of the first output terminal OUTT and a voltage $V_{OUTC}$ of the second output terminal OUTC is increased.

Conversely, supposing that when the signal DN is logic high, each of the switches S3 and S6 is turned on and each of the switches S4 and S5 is turned off, the first output terminal OUTT is discharged via the second current sink 247 and simultaneously the second output terminal OUTC is charged by the second current source 233. In this case, the difference between voltages input to the voltage controlled oscillator 260, i.e., the voltage $V_{OUTT}$ of the first output terminal OUTT and the voltage $V_{OUTC}$ of the second output terminal OUTC, is decreased.

The first differential switches S1 and S2 and the third differential switches S5 and S6 are embodied as PMOS transistors, while the second differential switches S7 and S8 and the fourth differential switches S3 and S4 are embodied as NMOS transistors. However, the switches S1 through S8 may be embodied differently.

FIG. 5 is a switching control signal generating circuit for controlling differential switches which are embodied as PMOS transistors. Referring to FIG. 5, the switching control signal generating circuit 239 includes a pair of input terminals, 2391 and 2392, a pair of output terminals 2395 and 2396, and a conversion circuit. The conversion circuit includes a plurality of MOS transistors P1, P3, P5, and P7 and N1, N3, N5, and N7. Output signals of the pair of output terminals 2395 and 2396 are differential switching control signals SWPA and SWPB.

Based on a logic state of each of the differential signals UP, UPB, DN, and DNB input via the pair of input terminals 2391 and 2392 a relatively high level is set at a first power supply voltage VDD and a low level is set at a second power supply voltage CML. The conversion circuit transitions the differential switching control signals SWPA (first signal) and SWPB (second signal) from the low level to the high level and back to the low level, at different time points.

There is a delay time Δt between a time when the first signal starts to transition to the level of the second signal CML and a time when the second signal CML starts to transition to the level of the first signal VDD or vice versa.

A first inverter is formed of a PMOS transistor P1 and an NMOS transistor N1, and a second inverter is formed of a PMOS transistor P5 and an NMOS transistor N5. A first pull-up circuit is embodied as a PMOS transistor P3, which is connected between a first power supply voltage VDD and the first output terminal 2395. The gate of the PMOS transistor P3 is coupled to the output terminal 2393 of the first inverter. Thus, the PMOS transistor P3 pulls up the first output terminal 2395 to the level of the first power supply voltage in response to an output signal of the first inverter.

A first pull-down circuit is embodied as an NMOS transistor N3, which is connected between the first output terminal 2395 and a second power supply voltage (½)VDD. The gate of the NMOS transistor N3 is coupled to the input terminal 2392. Thus, the NMOS transistor N3 pulls down the first output terminal 2395 to a level of the second power supply voltage (½)VDD in response to the signal UPB (or DNB) input to the input terminal 2392.

A second pull-up circuit is embodied as a PMOS transistor P7, which is connected between the first power supply voltage VDD and the second output terminal 2396. The gate of the PMOS transistor P7 is coupled to the output terminal 2394 of the second inverter. Thus, the PMOS transistor P7 pulls up the second output terminal 2396 to the level of the first power supply voltage VDD in response to an output signal of the second inverter.

A second pull-down circuit is embodied as an NMOS transistor N7, which is connected between the second output terminal 2396 and the second power supply voltage (½) VDD. The gate of the NMOS transistor N7 is coupled to the input terminal 2391. Thus, the NMOS transistor N7 pulls down the second output terminal 2396 to the level of the second power supply voltage (½)VDD in response to a signal UP (or DN) input to the input terminal 2391.

For example, when the first differential signals UP and UPB swing between the first power supply voltage VDD and the ground voltage VSS, respectively, the first differential switching control signals SWPA and SWPB preferably swing between the first power supply voltage VDD and the second power supply voltage (½)VDD, respectively.

Each of the switches S1, S2, S5, and S6, illustrated in FIG. 3, can be switched to the first power supply voltage VDD and switches S3, S4, S7, and S8 can be switched to the ground voltage (e.g., 0V). A noise, e.g. caused by AC coupling in each of the output terminals OUTT and OUTC, can be reduced by using a voltage level for turning on each of the switches S1 through S8, preferably (½)VDD.

For instance, when the signal UP of the first differential signals UP and UPB is the first power supply voltage VDD and the signal UPB is 0V, the second pull-down circuit N7 is turned on in response to the signal UP and the voltage of the second output terminal 2396 becomes the second power supply voltage (½)VDD. Also, the first pull-up circuit P3 is turned on in response to the voltage of the output terminal 2393 of the first inverter and the voltage of the first output terminal 2395 becomes the first power supply voltage VDD.

When the signal UP transitions from the first power supply voltage VDD to 0V and the signal UPB transitions from 0V to the first power supply voltage VDD, as the first pull-down circuit N3 is turned on earlier than the second pull-up circuit P7, the voltage of the first output terminal 2395 starts to transition from the first power supply voltage VDD to the second power supply voltage (½)VDD and after a delay time Δt caused by the second inverter, the second output terminal 2396 starts to transition from the second power supply voltage (½)VDD to the first power supply voltage VDD.

When the signal UP transitions to the first power supply voltage VDD and the signal UPB transitions to 0V, as the second pull-down circuit N7 is turned on earlier than the first pull-up circuit P3, the voltage of the second output terminal 2396 starts to transition from the first power supply voltage VDD to the second power supply voltage (½)VDD and after a delay time Δt caused by the first inverter, the first output terminal 2395 starts to transition from the second power supply voltage (½)VDD to the first power supply voltage VDD. The first and second inverters may also be embodied as other types of delay circuits.

Referring to FIGS. 3 through 5, there can be a gap of the delay time Δt caused by the first inverter and/or the second inverter between a period where a state of the switch S1 is changed and a period where a state of the switch S2 is changed. Therefore, in an embodiment, the differential switches S1 and S2 may never be simultaneously turned off. Likewise, the differential switches S5 and S6 may never be simultaneously turned off. As a result, glitches in the current flowing through the differential switches S1, S2, S5, and S6 are reduced during switching.

FIG. 6 is a switching control signal generating circuit for controlling differential switches which are embodied as NMOS transistors. Referring to FIG. 6, the switching control signal generating circuit 241 includes a pair of input terminals 2411 and 2412, a pair of output terminals 2415 and 2416, and a conversion circuit. The conversion circuit includes a plurality of MOS transistors P11, P13, P15, and P17 and N11, N13, N15, and N17.

Based on a logic state of each of the differential signals DN, DNB, UP, and UPB input via the pair of input terminals 2411 and 2412, a relatively high level is set at a first power supply voltage VDD and a low level is set at a second power supply voltage CML. The conversion circuit transitions the switching control signals SWNA and SWNB from the low level to the high level and back to the low level, at different time points.

A first inverter is formed of a PMOS transistor P11 and an NMOS transistor N11, and the second inverter is formed of a PMOS transistor P15 and an NMOS transistor N15. The first pull-down circuit is embodied as an NMOS transistor N13, which is connected between a ground voltage VSS and the first output terminal 2415. The gate of the NMOS transistor N13 is coupled to the output terminal 2413 of the first inverter. Thus, the NMOS transistor N13 pulls down the first output terminal 2415 to the level of the ground voltage in response to the output signal of the first inverter.

A first pull-up circuit is embodied as a PMOS transistor P13, which is connected between the first output terminal 2415 and a power supply voltage (½)VDD. The gate of the PMOS transistor P13 is coupled to the input terminal 2412. Thus, the PMOS transistor P13 pulls up the first output terminal 2415 to the level of the power supply voltage (½)VDD in response to the signal DNB (or UPB) input to the input terminal 2412.

The second pull-down circuit is embodied as an NMOS transistor N17, which is connected between the second output terminal 2416 and the power supply voltage (½) VDD. The gate of the NMOS transistor N17 is coupled to the input terminal 2411. Thus, the PMOS transistor P17 pulls up the second output terminal 2416 to the level of the power supply voltage (½)VDD in response to the signal DN (or UP) input to the input terminal 2411.

For example, when the second differential signals DN and DNB swing between the first power supply voltage VDD and the ground voltage VSS and between the ground voltage VSS and the first power supply voltage VDD, the differential switching control signals SWNA and SWNB preferably swing between the power supply voltage (½)VDD (=CML) and the ground voltage VSS and between the ground voltage VSS and the power supply voltage (½)VDD.

Each of the switches S1, S2, S5, and S6, illustrated in FIG. 3, can be switched to the first power supply voltage VDD and switches S3, S4, S7, and S8 can be switched to the ground voltage (e.g., 0V). A noise, e.g. caused by AC coupling in each of the output terminals OUTT and OUTC, can be reduced by using a voltage level for turning on each of the switches S1 through S8, preferably (½)VDD.

For instance, when the signal DN of the second differential signals DN and DNB is the first power supply voltage VDD and the signal DNB is 0V, the first pull-up circuit P13 is turned on in response to the signal DNB and the voltage of the first output terminal 2415 becomes the power supply voltage (½)VDD. Also, the second pull-down circuit N17 is turned on in response to the voltage of the output terminal 2414 of the second inverter and the voltage of the second output terminal 2416 becomes the ground voltage VSS.

When the signal DN transitions from the first power supply voltage VDD to 0V and the signal DNB transitions from 0V to the first power supply voltage VDD, as the second pull-up circuit P17 is turned on earlier than the first pull-down circuit N13, the voltage of the second output terminal 2416 starts to transition from the ground voltage VSS to the power supply voltage (½)VDD and after a delay time Δt caused by the first inverter, the voltage of the first output terminal 2415 starts to transition from the power supply voltage (½)VDD to the ground voltage VSS.

When the signal DN transitions from 0V to the power supply voltage VDD and the signal DNB transitions from the first power supply voltage VDD to 0V, as the first pull-up circuit P13 is turned on earlier than the second pull-down circuit N17, the voltage of the first output terminal 2415 starts to transition from the ground voltage VSS to the power supply voltage (½)VDD and after a delay time Δt caused by the second inverter, the second output terminal 2416 starts to transition from the power supply voltage (½)VDD to the ground voltage VSS.

Referring to FIGS. 3, 4, 5, and 6, there is a gap of the delay time Δt caused by the first inverter and/or the second inverter between a period where a state of the switch S1 is changed and a period where a state of the switch S2 is changed. Therefore, in an embodiment, the differential switches S3 and S4 may never be simultaneously turned off. Likewise, the differential switches S5 and S6 may never simultaneously be turned off. As a result, glitches in the current flowing through the differential switches S3, S4, S7, and S8 can be reduced during switching.

Figure 7A:
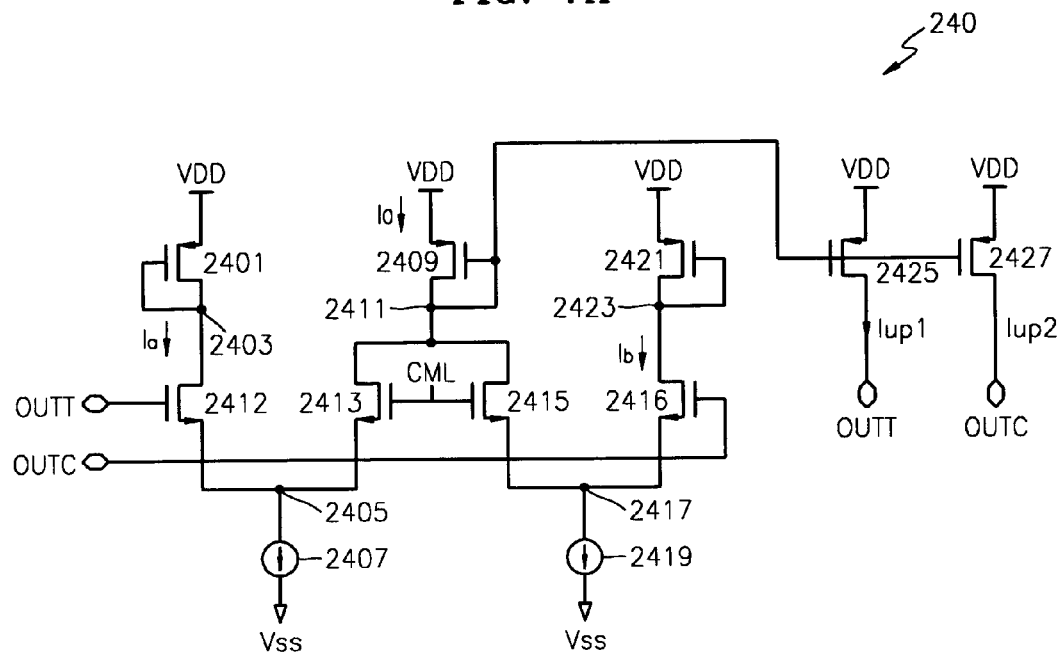
FIGS. 7A and 7B illustrate common mode feedback circuits of FIG. 2 in an exemplary embodiment of the present invention.
Figure 7B:
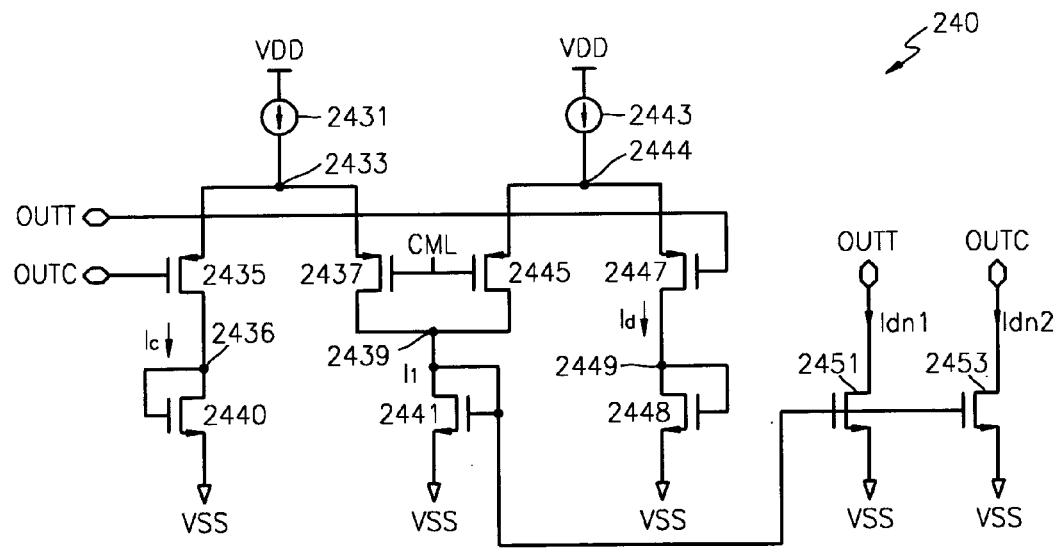

FIGS. 7A and 7B are circuit diagrams of the common mode feedback circuit 240 of FIG. 2. Referring to FIGS. 7A and 7B, the common mode feedback circuit 240 includes a plurality of current sources 2407, 2419, 2431, and 2443, and a plurality of MOS transistors.

Referring to FIG. 2, when the pumping circuit outputs differential signals OUTT and OUTC, a common voltage of the differential signals OUTT and OUTC should be held constant, this can be accomplished by the common mode feedback circuit 240. Here, the common voltage is a half of the sum of the voltage of the first output terminal OUTT and the voltage of the second output terminal OUTC.

In FIG. 7A, the PMOS transistor 2401 is connected between VDD and a node 2403. The gate of the PMOS transistor 2401 is coupled to the node 2403 and current Ia flows through the drain thereof. The NMOS transistor 2412 is connected between the node 2403 and a node 2405. The first output terminal OUTT is coupled to the gate of the NMOS transistor 2412. The current source 2407 is connected between the node 2405 and the ground voltage.

The PMOS transistor 2409 is connected between the first power supply voltage VDD and a node 2411. The gate of the PMOS transistor 2409 is coupled to the node 2411 and current Io flows through the source thereof. The NMOS transistor 2413 is connected between the node 2411 and the node 2405, and the NMOS transistor 2415 is connected between the node 2411 and a node 2417. The gate of each of the NMOS transistors 2413 and 2415 is coupled to the second power supply voltage CML.

The PMOS transistor 2421 is connected between VDD and a node 2423. The gate of the PMOS transistor 2421 is coupled to the node 2423 and current Ib flows through the drain thereof. The NMOS transistor 2416 is connected between the node 2423 and the node 2417 and the second output terminal OUTC is coupled to the gate thereof. The current source 2419 is connected between the node 2417 and the ground voltage.

The PMOS transistor 2425 is connected between VDD and the first output terminal OUTT. The gate of the PMOS transistor 2425 is coupled to the node 2411 and current Iup1 flows from the drain thereof to the first output terminal OUTT.

The PMOS transistor 2427 is connected between VDD and the second output terminal OUTC. The gate of the PMOS transistor 2427 is coupled to the node 2411 and current Iup2 flows from the drain thereof to the second output terminal OUTC. In this case, Io=Iup1=Iup2.

In FIG. 7B, the current source 2431 is connected between VDD and a node 2433 and a PMOS transistor 2435 is connected between the node 2433 and a node 2436. The second output terminal OUTC is coupled to the gate of the PMOS transistor 2435. The NMOS transistor 2440 is connected between the node 2436 and the ground voltage VSS, and the node 2436 is coupled to the gate of the NMOS transistor 2440. Here, current Ic flows through the drain of the PMOS transistor 2435.

The current source 2443 is connected between VDD and a node 2444, the PMOS transistor 2437 is connected between the node 2433 and a node 2439, and the PMOS transistor 2445 is connected between the node 2444 and the node 2439. The gates of the PMOS transistors 2437 and 2445 are coupled to the second power supply voltage CML. The NMOS transistor 2441 is connected between the node 2439 and the ground voltage VSS and current I1 flows through the drain thereof.

The PMOS transistor 2447 is connected between the node 2444 and a node 2449. The gate of the PMOS transistor 2447 is coupled to the first output terminal OUTT and current Id flows through the drain thereof.

The NMOS transistor 2448 is connected between the node 2449 and the ground voltage VSS and the node 2449 is coupled to the gate thereof.

The NMOS transistor 2451 is connected between VSS and the first output terminal OUTT. The gate of the NMOS transistor 2451 is coupled to the node 2439 and current Idn1 flows through the drain thereof.

The NMOS transistor 2453 is connected between VSS and the second output terminal OUTC. The gate of the NMOS transistor 2453 is coupled to the node 2439 and current Idn2 flows through the drain thereof. In this case, I1=Idn1=Idn2.

As the common voltage (a half of the sum of the voltage of the first output terminal OUTT and the voltage of the second output terminal OUTC) increases, the sum of the currents (Ia and Ib) increases and the sum of the currents (Ic and Id) decreases. That is, the current (Io=Iup1=Iup2) decreases, while the current (I1=Idn1=Idn2) increases. Accordingly, because the charge current increases, the common voltage also increases.

Figure 8:
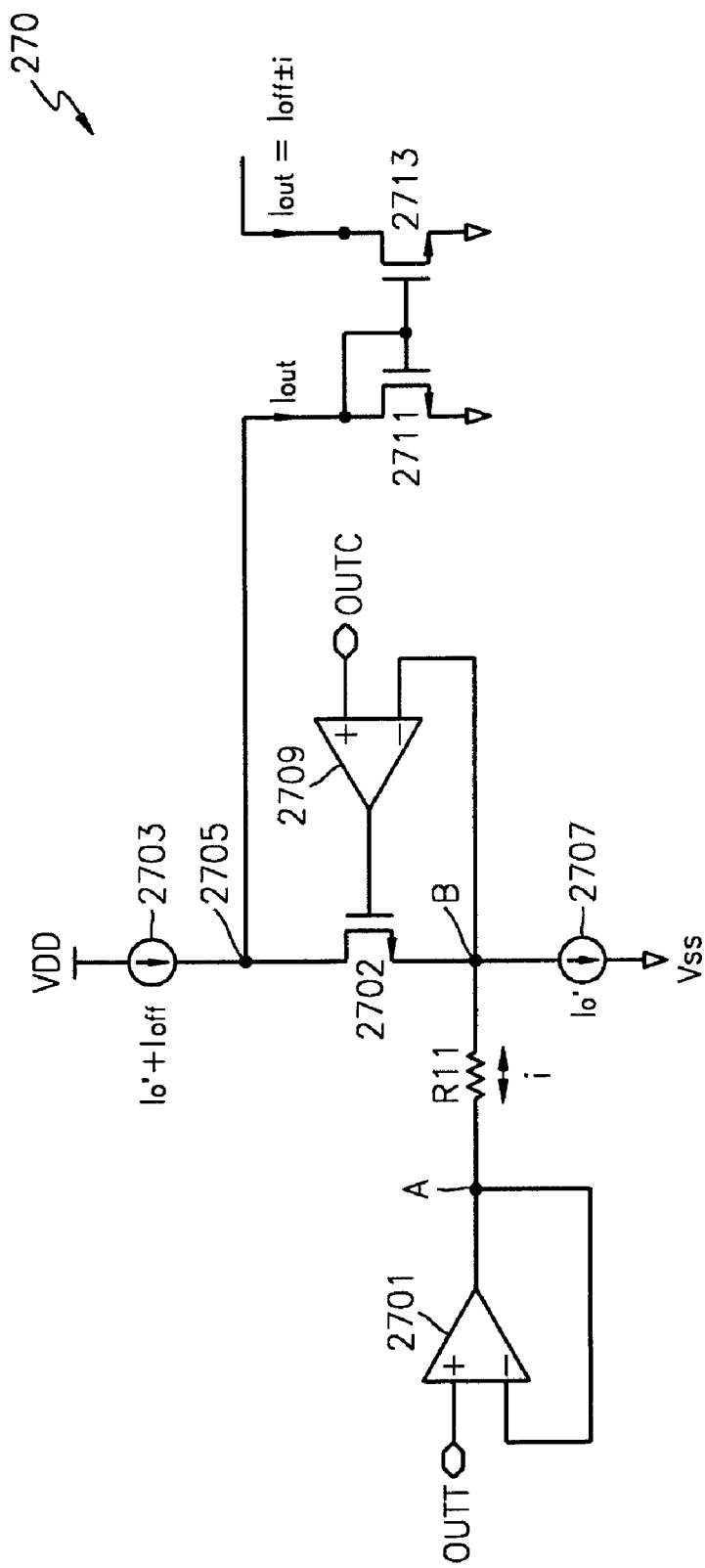
FIG. 8 is a voltage-current converter of FIG. 2 in an exemplary embodiment of the present invention.

FIG. 8 is a circuit diagram of the voltage-current converter 270 of FIG. 2. Referring to FIG. 8, the voltage-current converter 270 generates current corresponding to a voltage difference between the first output terminal OUTT and the second output terminal OUTC. The voltage-current converter 270 includes a first differential amplifier 2701, a second differential amplifier 2709, a current source 2703, a current sink 2707, a resistance R11, and three MOS transistors 2702, 2711, and 2713.

The positive (+) terminal of the first differential amplifier 2701 is coupled to the first output terminal OUTT and the negative (−) terminal thereof is coupled to the node A. The voltage of the node A is equal to the voltage $V_{OUTT}$ of the first output terminal OUTT.

The positive (+) terminal of the second differential amplifier 2709 is coupled to the second output terminal OUTC and the negative (−) terminal thereof is coupled to the node B. The voltage of the node B is equal to the voltage $V_{OUTC}$ of the second output terminal OUTC. A resistor R11 is connected between the output node A of the first differential amplifier 2701 and the node B.

The current source 2703 is connected between VDD and the node 2705 and sources current Io'+Ioff to the node 2705. The current sink 2707 is connected between the node B and the ground voltage VSS and sinks current Io' to the ground voltage.

The NMOS transistor 2702 is connected between the node 2705 and the node B, and the output terminal of the second differential amplifier 2709 is coupled to the gate of the NMOS transistor 2702.

The NMOS transistor 2711 is connected between the node 2705 and the ground voltage VSS. The gate of the NMOS transistor 2711 is coupled to the node 2705 and current Iout flows through the drain of the NMOS transistor 2711.

The NMOS transistor 2713 is connected between the output terminal of the voltage-current converter 270 and the ground voltage VSS. The gate of the NMOS transistor 2713 is coupled to the node 2705 and current Iout flows through the drain thereof. Referring to FIG. 2, the frequency oscillator 280 generates the output clock signal CVCO in response to the current Iout generated by the voltage-current converter 270.

Equation 1 represents the current i flowing through the resistance R11.

$$i=(V_{OUTT}-V_{OUTC})/R11 \qquad \text{[Equation 1]}$$

In this case, the current i may have the positive (+) or negative (−) value.

Accordingly, to make the current i always have the positive (+) value, the current Ioff should be represented as in Equation 2.

$$I_{out} = I_{off} \pm i \qquad \text{[Equation 2]}$$

As explained so far, the switching control signal generating circuit according to exemplary embodiments of the present invention can reduce the occurrence of glitches during switching.

According to exemplary embodiments of the present invention, the differential charge pump including the switching control signal generating circuit can reduce glitches from occurring in differential output signals.

According to exemplary embodiments of the present invention, jitter is reduced from an output signal of the phase locked loop including the differential charge pump. Thus, a circuit using the output signal of the phase locked loop as a reference signal has an improved timing margin, and the greatest operating frequency of a predetermined semiconductor device having the circuit can be increased.

Although embodiments of the present invention have been described with reference to various figures, the details of the figures should not be interpreted to limit the scope of the possible embodiments of the present invention. For example, FIG. 2 illustrates the use of first and second differential signals. The scope of the present invention is not limited to a first and second differential signal, a plurality of signals can be used. Likewise a plurality of output terminals can be used with a plurality of associated voltages. FIG. 3 illustrates a pumping circuit of an embodiment of the present invention. Likewise the scope of the present invention illustrated in FIG. 3 is not limited and may contain a plurality of charge sources, a plurality of switching control signals, a plurality of switches, a plurality of voltage levels, and a plurality of switching control signal generating circuits. FIGS. 5 and 6 illustrate switching control signal generating circuits according to embodiments of the present invention. The scope of the embodiments illustrated in FIGS. 5 and 6 are not limited and include, a plurality of input and output terminals, producing a plurality of differential switching control signals with various delay times between each.

While the exemplary embodiments of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A charge pump comprising:
   a first output terminal;
   a second output terminal;
   a first current source coupled to a power supply voltage;
   a second current source coupled to the power supply voltage;
   a first current sink coupled to a ground voltage;
   a second current sink coupled to the ground voltage;
   first differential switches which are connected between the first output terminal and the first current source and respond to first differential switching control signals;
   second differential switches which are connected between the second output terminal and the first current sink and respond to second differential switching control signals;
   third differential switches which are coupled to the second output terminal and the second current source and respond to the first differential switching control signals; and
   fourth differential switches which are connected between the second output terminal and the second current sink and respond to the second differential switching control signals.

2. The charge pump as claimed in claim 1, wherein the output signals of the first and second output terminals are differential signals or complementary signals.

3. The charge pump as claimed in claim 1, wherein the first current source, the second current source, the first current sink, and the second current sink have the same current values.

4. The charge pump as claimed in claim 1, further comprising a first switching control signal generating circuit for generating the first differential switching control signals, which includes:
   a pair of input terminals;
   a pair of output terminals; and
   a conversion circuit which converts differential signals input via the pair of input terminals into the first differential switching control signals and outputs the first differential switching control signals to the pair of output terminals, respectively,
   wherein based on a state of each of the differential signals input via the pair of input terminals, the conversion circuit makes a first one of the first differential switching control signals having a relatively high level and a second one of the first differential switching control signals having a relatively low level transition to the level of the second signal and the level of the first signal, respectively, at different time points.

5. The charge pump as claimed in claim 4, further comprising a second switching control signal generating circuit for generating the second differential switching control signals, which includes:
   a pair of input terminals;
   a pair of output terminals;
   a conversion circuit which converts differential signals input via the pair of input terminals into the second differential switching control signals and outputs the second differential switching control signals to the pair of output terminals, respectively,
   wherein based on a state of each of the differential signals input via the pair of input terminals, the conversion circuit makes a first one of the second differential switching control signals having a relatively high level and a second one of the second differential switching control signals having a relatively low level transition to the level of the second signal and the level of the first signal, respectively, at different time points.

6. The charge pump as claimed in claim 1, further comprising a common mode feedback circuit which is coupled to the first output terminal and the second output terminal and holds a common voltage of the output signal of the first output terminal and the output signal of the second output terminal to a constant value.

7. A charge pump comprising:
   a first input terminal;
   a second input terminal;
   a third input terminal;
   a fourth input terminal;
   a first output terminal;
   a second output terminal;

a switching control signal generating circuit providing first differential signals to at least one of the first and second input terminals and second differential signals to at least one of the third and fourth input terminals;

a pumping circuit which charges the first output terminal to a first voltage and simultaneously discharges the second output terminal into a second voltage in response to the first differential signals input to the first and second input terminals, or charges the second output terminal to the first voltage and simultaneously discharges the first output terminal into the second voltage in response to the second differential signals input to the third and fourth input terminals; and a common mode feedback circuit which is coupled to the first and second output terminals and holds a common voltage of output voltages of the first and second output terminals to a given value, wherein the output voltage of the first output terminal and the output voltage of the second output terminal are differential signals.

8. A phase locked loop including the charge pump as claimed in claim 7, comprising:

a phase-frequency detecting circuit which outputs the first differential signals and the second differential signals; and a voltage controlled oscillator which generates an output clock signal in response to a difference between the output voltage of the first output terminal and the output voltage of the second output terminal, wherein the phase-frequency detecting circuit outputs the first differential signals and the second differential signals in response to a reference clock signal and the output clock signal.

9. The phase locked loop as claimed in claim 8, wherein the voltage controlled oscillator includes:

a voltage-current converter which generates current corresponding to the difference between the output voltage of the first output terminal and the output voltage of the second output terminal; and a vibrator which generates the output clock signal in response to the output signal of the voltage-current converter.

10. The phase locked loop as claimed in claim 8, wherein when the phase locked loop further includes a frequency divider to divide the output clock signal output from the voltage controlled oscillator, the phase-frequency detecting circuit outputs the first differential signals and the second differential signals in response to the reference clock signal and the output clock signal output from the frequency divider.

* * * * *